United States Patent [19]

Ohya et al.

[11] Patent Number: 5,531,945

[45] Date of Patent: Jul. 2, 1996

[54] PROCESS FOR THE PRODUCTION OF BASE BOARD FOR PRINTED WIRING

[75] Inventors: Kazuyuki Ohya; Norio Sayama, both of Tokyo, Japan

[73] Assignee: Mitsubishi Gas Chemical Company, Inc., Tokyo, Japan

[21] Appl. No.: 246,497

[22] Filed: May 20, 1994

Related U.S. Application Data

[63] Continuation-in-part of Ser. No. 45,473, Apr. 13, 1993, abandoned.

[30] Foreign Application Priority Data

Apr. 13, 1992 [JP] Japan .................................. 4-92772
Nov. 13, 1992 [JP] Japan .................................. 4-303796

[51] Int. Cl.$^6$ .............................. C04B 41/81; B28B 11/02
[52] U.S. Cl. ...................... 264/60; 156/185; 156/191; 264/61; 264/67; 264/137; 264/158; 264/257; 264/511
[58] Field of Search ...................... 264/60, 61, 67, 264/129, 134, 136, 137, 158, 297.9, DIG. 63, 257, 258, 511; 174/255, 260, 256; 428/210, 908, 320.2, 319.3; 156/172, 184.1, 185, 191; 425/388, 289

[56] References Cited

U.S. PATENT DOCUMENTS

| | | | |
|---|---|---|---|
| 4,865,784 | 9/1989 | Hill | 264/120 |
| 4,882,455 | 11/1989 | Sato et al. | 174/68.5 |
| 4,963,414 | 10/1990 | LeVasseur et al. | 428/195 |
| 5,061,548 | 10/1991 | Arthur et al. | 428/901 |
| 5,110,654 | 5/1992 | Yokokawa | 174/255 |
| 5,116,663 | 5/1992 | Fujimoto et al. | 428/901 |
| 5,144,536 | 9/1992 | Tsukada | 361/402 |
| 5,248,852 | 9/1993 | Kumagai | 174/250 |

FOREIGN PATENT DOCUMENTS

| | | | |
|---|---|---|---|
| 0196865 | 10/1986 | European Pat. Off. | |
| 0411639 | 2/1991 | European Pat. Off. | |
| 0566360 | 10/1993 | European Pat. Off. | |
| 2-263630 | 10/1990 | Japan | 428/901 |
| 2-293132 | 12/1990 | Japan | 428/901 |
| 3-149891 | 6/1991 | Japan | 174/255 |
| 3-149890 | 6/1991 | Japan | 174/255 |
| 5-090721 | 4/1993 | Japan | 174/258 |
| 5-082929 | 4/1993 | Japan | 174/258 |
| 5-291706 | 11/1993 | Japan | |
| 6-152086 | 5/1994 | Japan | |
| WO-A-9218213 | 10/1992 | WIPO | |

OTHER PUBLICATIONS

Iwata et al., Proceedings of the 37th Electronic Components Conference, 11–13 May, 1987, pp. 392–397.

Ibiden Co., Ltd., Patent Abstracts of Japan, vol. 013, No. 307 (E-787), 13 Jul., 1989, Abstracting JP-A-10 82 689 28 Mar. 1989.

Sumitomo Chem. Co., Ltd., Patent Abstracts of Japan, vol. 015, No. 375 (E-1114), 20 Sep. 1991 Abstracting JP-A-31 49 891 26 Jun., 1991.

Ibiden Co., Ltd., Patent Abstracts of Japan, vol. 016, No. 150 (E-1189), 14 Apr.., 1992 Abstracting JP-A-40 05 882 9 Jan., 1992.

*Primary Examiner*—Jay H. Woo
*Assistant Examiner*—Duane S. Smith
*Attorney, Agent, or Firm*—Wenderoth, Lind & Ponack

[57] ABSTRACT

A process is provided for the production of a base board for printed wiring. The process involves the steps of wrapping a block inorganic continuous porous material with a cloth, impregnating the wrapped block inorganic continuous porous material with a thermosetting resin under reduced pressure, curing the thermosetting resin to form a composite material, and slicing the composite material into base boards having a thickness of 0.2 to 2 mm and a thickness allowance of ±5 μm or less, or the steps of impregnating a block inorganic continuous porous material with a thermosetting resin in an impregnation vessel under reduced pressure, taking the block inorganic continuous porous material impregnated from the impregnation vessel, substantially removing the thermosetting resin adhering to surfaces of the block inorganic continuous porous material before the thermosetting resin forms a gel, curing the remaining thermosetting resin under heat to form a composite material, and slicing the composite material into base boards having a thickness of 0.2 to 2 mm and a thickness allowance of ±5 μm or less.

11 Claims, No Drawings

PROCESS FOR THE PRODUCTION OF BASE BOARD FOR PRINTED WIRING

This application is a continuation-in-part of now abandoned application, Ser. No. 08/045,473 filed Apr. 13, 1993, abandoned.

FIELD OF THE INVENTION

The present invention relates to a process for the production of a novel base board for printed wiring, which has excellent thickness accuracy, a low coefficient of thermal expansion, high heat dissipation properties and high heat resistance, and which is useful with high frequency and for directly mounting a semiconductor chip.

PRIOR ART

A printed wiring board for use with high frequency is required to have electric properties such as small thermal dependency and a low dielectric loss tangent. In addition to these requirements, since the wavelength and the thickness of the board are generally in the same range of thickness, the board functions in a way in which parts and chips of a conventional circuit function, and for this reason, the printed wiring board is also required to have high thickness accuracy. Further, a board on which a semiconductor chip is to be directly mounted is required to have a low coefficient of thermal expansion and high heat dissipation properties.

A variety of materials having low dielectric loss tangents and a variety of base boards from ceramics have been developed in order to meet with the above requirements, and some of them have been put to practical use.

However, a base board produced by a conventional lamination method has a thickness accuracy of within ±5% at best. Even if the production of the board or the board itself is devised, the ultimate thickness accuracy is within 2%.

For producing a base board from a ceramic, it is essential to produce the base board by calcining the ceramic at a high temperature. Therefore, when a thin base board having a thickness of about 1/40" (0.63 mm) is produced, it is difficult to maintain its thickness accuracy precisely, and further, it is very difficult to produce a base board free of distortion and strain.

Ceramic can give a base board having a low coefficient of thermal expansion and high heat dissipation properties. However, ceramic is generally poor in machinability. Therefore, studies are being made of a method in which a base board having through holes is produced by calcining a green sheet having holes in predetermined positions, or of a method in which a printed wiring network is formed on a green sheet from an electrically conductive paste which can be calcined at a high temperature, and the green sheet is calcined. And, the practical use of these methods is under way. However, the defects with these methods are that the production steps are complicated and that printed wiring boards obtained by these methods are expensive.

The development of machinable ceramics has been recently under way, and most of them are inorganic continuous porous materials. Since, however, the continuous porous materials easily absorb a liquid into their pores due to its continuous porous property, it is impossible to form a printed wiring network, for example, by electroless copper plating. Further, non-oxide-based ceramics are generally liable to react with water. In particular, AlN generates ammonia when heated to 80° C. or higher in the presence of water, and it is converted into β-alumina or aluminum hydroxide. As a result, when the inorganic continuous porous material imparted with machinability is used as a base board for printed wiring, it is essentially required to form a printed wiring network in a dry state and form a resist coating in a dry state.

Further, it is conceivable to employ a method in which a block of an inorganic continuous porous material is produced from a ceramic and the block is sliced in a dry method to prepare base boards. However, although being excellent in flexural strength, this inorganic continuous porous material has inferior impact resistance. When it has a decreased thickness, it is easily fractured and difficult to slice. Moreover, it is much more difficult to process such a fragile base board for forming a printed wiring.

SUMMARY OF THE INVENTION

It is an object of the present invention to provide a process for the production of a novel base board for printed wiring, which has high thickness accuracy and permits the formation of a printed wiring network by most general methods such as wet electroless copper plating without impairing the excellent properties of an inorganic continuous porous material such as a low coefficient of thermal expansion, high heat dissipation properties and high machinability.

According to a first aspect of the present invention, there is provided a process for the production of a base board for printed wiring, which comprises wrapping a block inorganic continuous porous material (I) (to be abbreviated as "Material (I)" hereinafter) with a cloth (IV), impregnating the wrapped Material (I) with a thermosetting resin (II) under reduced pressure, curing the thermosetting resin to form a composite material (III), and slicing the composite material (III) into base boards having a thickness of 0.2 to 2 mm and a thickness allowance of ±5 μm or less.

Further, according to a second aspect of the present invention, there is also provided a process for the production of a base board for printed wiring, which comprises impregnating Material (I) with a thermosetting resin (II) in an impregnation container under reduced pressure, taking the impregnated Material (I) from the impregnation container, substantially removing the thermosetting resin (II) adhering to surfaces of the impregnated Material (I) before the thermosetting resin (II) froms a gel, curing the remaining thermosetting resin under heat to form a composite material (III), and slicing the composite material (III) into base boards having a thickness of 0.2 to 2 mm and a thickness allowance of ±5 μm or less.

DETAILED DESCRIPTION OF THE INVENTION

In the Material (I) of the present invention, the porosity is 10 to 40%, preferably 12 to 30%, and the average pore diameter is 0.1 to 10 μm, preferably 0.5 to 6 μm. The Material (I) is preferably selected from the group consisting of aluminum nitride-hexagonal boron nitride (AlN-h-BN), alumina-hexagonal boron nitride ($Al_2O_3$-h-BN), zircon oxide-hexagonal boron nitride ($ZrO_2$-h-BN), silicon nitride-hexagonal boron nitride ($Si_3N_4$-h-BN), hexagonal boron nitride (h-BN), β-wollostonite (β-$CaSiO_3$) and mica. Particularly preferred are AlN-h-BN and β-$CaSiO_3$.

In the first aspect of present invention, the cloth (IV) is preferably selected from a glass woven fabric and a glass nonwoven fabric.

In the present invention, it is preferred to heat-treat the Material (I) under reduced pressure before the impregnation with the thermosetting resin (II). In this case, the Material (I) may be wrapped or unwrapped with the cloth (IV). This heat treatment under reduced pressure is preferably carried out at a temperature between 70° and 250° C. under a pressure of 30 mmHg or less for 0.5 to 72 hours.

The composite material (III) is sliced with a saw selected from the group consisting of a multiwire saw, a multiwire saw with diamond on wire, a multiblade saw, a multiblade saw with diamond on blade and an inner diameter slicing diamond saw.

In the second aspect of the present invention, the Material (I) has a porosity of 12 to 36% and an average pore diameter of 0.5 to 6 μm.

Further, the Material (I) is formed of a material selected from the group consisting of aluminum nitride-hexagonal boron nitride (AlN-h-BN) and β-wollastonite (β-CaSiO$_3$). The material (I) is preliminarily heat-treated at 70° to 250° C. under reduced pressure at 30 mmHg for 0.5 to 72 hours. The composite material (III) is sliced with a saw selected from the group consisting of a multiwire saw, a multiwire saw with diamond on wire, a multiblade saw, a multiblade saw with diamond on blade and an inner diameter slicing diamond saw.

Inorganic Continuous Porous Material (I)

The Material (I) used in the present invention generally produced by incorporating a sintering aid and mixing aids such as an organic solvent and water into an inorganic powder as required to form a homogeneous mixture, shaping the mixture into a desired plate, cube, cylinder or other block under a high pressure or ultrahigh pressure under conditions where the mixing aid, etc., can be properly removed, completely removing the mixing aid, etc., by drying or heating, and sintering the shaped body by calcining it.

The Material (I) used in the present invention preferably has the form of a plate whose surface is rectangular or square, in view of the production of the inorganic continuous porous material (I) which shows little variability in physical properties among lots, maintenance of impregnatability and the use thereof as base board for printed wiring. The Material (I) preferably has a thickness of 2 to 10 cm, a length of 5 to 30 cm and a width of 5 to 40 cm.

The above inorganic powder can be selected from those which are usable in an electric field in terms of heat resistance, electric properties, etc. In the present invention, the above inorganic powder is selected from those which have machinability as well as the above properties.

Specifically, the above inorganic powder includes a mixture of an aluminum nitride powder and a hexagonal boron nitride powder (for AlN-h-BN), a mixture of an alumina powder and a hexagonal boron powder (Al$_2$O$_3$-h-BN), a mixture of a zircon oxide powder and a hexagonal boron nitride powder (ZrO$_2$-h-BN), a mixture of a silicon carbide powder and a hexagonal boron nitride powder (SiC-h-BN) and a mixture of a silicon nitride powder and a hexagonal boron nitride powder (Si$_3$N$_4$-h-BN). The h-BN content of these mixtures is 10 to 50% by weight, preferably 10 to 25% by weight. Further, the inorganic powder includes a hexagonal boron nitride powder (h-BN), β-wollastonite (β-CaSiO$_3$), cordierite and mica. Particularly preferred are AlN-h-BN and β-CaSiO$_3$.

Material (I) is generally produced by calcining the above inorganic powder in the presence of a sintering aid which is to impart the Material (I) with the desired machinability. When a mixture of an aluminum nitride powder and a hexagonal boron nitride powder is used, h-BN works as a sintering aid and a pore former, while the sintering aid can be selected from oxides of rare earth elements typified by yttria and oxides of alkaline earth elements typified by calcia. When β-CaSiO$_3$ is used, a sintered body having improved heat resistance can be obtained in the presence of 1 to 18% by weight of MgO as a sintering aid.

When the Material (I) is formed of any one of the above AlN-h-BN, Al$_2$O$_3$-h-BN, ZrO$_2$-h-BN and Si$_3$N$_4$-h-BN, the BN component works as a pore former, and the pore diameter depends upon the particle diameter of the h-BN powder. The smaller the particle diameter of the powder, the smaller the pore diameter. Further, the smaller the particle diameter of the powder, the more improved the mechanical strength and processing accuracy. The porosity differs depending upon the kind and amount of the used sintering aid. On the other hand, when the same sintering aid is used, the porosity differs depending upon the amount of the used h-BN component. With an increase in the amount of the used h-BN component, the porosity increases, while the mechanical strength, etc., decrease. When any fine powder of h-BN, β-wollastonite and mica is used, the pore size is determined depending upon the particle diameter of the used powder. With a decrease in the particle diameter of the powder, the pore size decreases and the mechanical strength and processing accuracy increase.

The base board for printed wiring, provided by the present invention, is a product formed by integrating the above Material (I) and the thermosetting resin (II). Therefore, the base board for printed wiring is greatly improved in mechanical and chemical properties. In view of this point, it cannot be necessarily said that base board having smaller pore diameters is always excellent.

With an increase in the pore diameter, the impregnation becomes easier. With a decrease in the pore diameter, the uniformity of the Material (1) increases. Further, for producing the Material (I) having less variability among lots from a fine powder of a non-oxide material such as a mixture of AlN and h-BN powders, it is also required to control the material and calcining very precisely. In view of the above points, the inorganic continuous porous material (I) is preferably produced by selecting the particle diameter of the inorganic powder to achieve the following. That is, the average pore diameter is 0.1 to 10 μm, preferably 0.5 to 6 μm, and the porosity is generally 10 to 40%, preferably 10 to 35%, more preferably 15 to 25%.

In the base board for printed wiring, provided by the present invention, for example, the dielectric loss tangent and thermal conductivity are more important than the density, strength and heat resistance, and preferred is the Material (I) which is produced so as to show less variability among lots concerning the above more important properties.

Cloth (IV)

The cloth (IV) used in the present invention can be selected from those which can endure the temperatures for impregnation with the thermosetting resin (II) and curing it and which inhibits broadening of any crack which has occurred in a cured resin. Specific examples of the cloth (IV) include glass woven fabric, glass unwoven fabric, glass woven fabric treated with Teflon, glass unwoven fabric treated with Teflon, ceramic fiber cloth, and the like. In view of availability, price and easiness in cutting, preferred is glass woven fabric.

Thermosetting Resin (II)

The thermosetting resin (II) used in the present invention is preferably selected from thermosetting resins which are cured by addition polymerization without forming any byproducts. Specific examples of the thermosetting resin (II) include a phenolic resin, an epoxy resin, an unsaturated polyester resin, a diallyl phthalate resin, an acrylic resin, a cyanato resin (produced from cyanate esters as an essential component), a maleimide resin, a maleimide-vinyl resin, other thermosetting resins and compositions of at least two of these resins. In view of the use for impregnation, preferred are thermosetting resins which are in a liquid state at room temperature or are melted by heating and which have a low viscosity. Of the above resins, preferred is a cyanato resin which includes, for example, a cyanate ester resin, a cyanate ester-maleimide resin, a cyanate ester-maleimide-epoxy resin and a cyanate acid ester-epoxy resin (DE-1,190, 184 and U.S. Pat. No. 4,116,946).

An aid for improving the thermosetting resin (II) in the affinity to the Material (I) may be incorporated into the thermosetting resin (II). The above aid includes a silane coupling agent and other coupling agent. The aid is selected by taking into account the inorganic continuous porous material (I) and the thermosetting resin (II) to be used. It is much more preferred to select the thermosetting resin (II) having high affinity to the inorganic continuous porous material (I).

Further, the thermosetting resin (II) may contain a curing catalyst for promoting the curing reaction and a flame retardant for maintaining flame retardancy when the Material (I) has a high porosity.

Preparation of Composite Material (III)

Preliminary Treatment of Material (I)

The composite material (III) is formed by wrapping the above Material (I) with one piece, or a plurality of pieces, of the cloth (IV), impregnating the wrapped material with the thermosetting resin (II) and curing the thermosetting resin (II), or by stacking a plurality of the Materials (I) optionally through one sheet or a plurality of sheets of the cloth (IV) to form a pile, wrapping the pile with the cloth (IV), impregnating the wrapped pile with the thermosetting resin (II) and curing the thermosetting resin (II).

The thickness of the above pile as an integrated block is generally 8 cm or more, preferably 15 to 80 cm, particularly preferably 15 to 40 cm in view of easiness in slicing, while this thickness can be properly set depending upon a slicing apparatus such as a diamond saw, multiwire saw, multiblade saw, etc.

The Material (I) is wrapped with the cloth (IV) and impregnated with the thermosetting resin (II).

The reasons for the above wrapping are as follows. First, since the Material (I) and the thermosetting resin (II) attached to the Material (I) greatly differ from each other in curing shrinkage factor and thermal expansion coefficient, the thermosetting resin (II) attached to the surface of the Material (I) undergoes cracking due to its curing. The above wrapping prevents this crack from reaching the interior of the Material (I). Secondly, when the block of the Material (I) having a large size or the pile of a plurality of the Materials (I) is impregnated, the Material (s) (I) is easily dried by heating under reduced pressure due to the presence of the cloth (IV) between the Materials (I). Further, a vary small amount of air, water adsorbed on the material surface and other volatiles can be easily removed from the Material (I) during the impregnation.

The Material (I) is preferably stored in a closed system after being produced. When the Material (I) absorbs water in air, the affinity and adhesion of the Material (I) to the thermosetting resin (II) may be impaired, and the Material (I) may have a portion which cannot be impregnated due to absorbed water.

It is there fore preferred to fully dry the Material (I) before the impregnation. For this purpose, the inorganic continuous porous material (I) is dried at a temperature between 70° and 250° C. under a pressure of 30 mmHg or less for 0.5 to 72 hours. Specifically, the Material (I) may be heated stepwise under reduced pressure within the above ranges depending upon the Material (I).

When the Material (I) has absorbed a liquid such as water, it is very difficult to dry it under general conditions. In particular, some of the non-oxide materials undergo a run away reaction at a high temperature required for drying it for a short period of time. It is necessary to take care when such materials are handled. For example, when heated to 80° C. or higher in the presence of water, AlN generates ammonia and is converted to β-alumina or aluminum hydroxide.

In the second aspect of the present invention, the Material (I) is impregnated with a thermosetting resin (II) without wrapping it with a cloth (IV), and the resin on the surface is substantially removed, as will be explained later. In this case, the impregnated Material (I) is preliminarily dried as described above.

Impregnation

The impregnation is carried out by a spontaneous impregnation method in which the above Material (I) and the thermosetting resin (II) whose amount has been measured beforehand are placed in a container or mold which permits decreasing of the pressure and heating as required, preferably decreasing the pressure in the system and heating the thermosetting resin (II) to melt it for the impregnation, or by a method in which the Material (I) is placed in a container or mold which permits decreasing of the pressure anti heating, the Material (I) is dehydrated/dried under heat by decreasing the pressure in the system as required, and gradually supplying the thermosetting resin (II), which has been melted and degassed under reduced pressure, preferably from under Material (I) at a rate meeting the impregnation rate.

The gap between the Material (I) and the above container or mold is preferably nearly constant, for example, about 0.5 to 3mm. When the thickness of the thermosetting resin adhering to the surface of the Material (I) differs from place to place, a bending stress acts on the Material (I). This bending stress can be decreased when the above gap is nearly constant as above.

It is preferred to use a disposable inner container specialized for the impregnation in the above container or mold. The dispensable inner container specialized for the impregnation has mold releasability and heat resistance, or it can be cut apart and formed, for example, of aluminum or a resin having a heat resistance against a temperature of 200° C. or higher.

The pressure for the impregnation can be set from reduced pressure to high pressure including ultrahigh pressure depending upon the performances of the container or mold and the inner container.

When the Material (I) and the thermosetting resin (II) have high affinity to each other, the preliminary degassing treatment is not necessary. In this case, the Material (I) may be impregnated with the thermosetting resin (II) while degassing the thermosetting resin (II) at atmospheric pressure, and this impregnation is carried out one-directionally or consecutively from one surface to another, whereby the Material (I) is uniformly impregnated with the thermosetting resin (II). However, when the Material is nonuniform, or depending upon controlling the impregnation method, the impregnation is sometimes nonuniform or the Material (I) sometimes has an insufficiently impregnated portion inside. For carrying out the uniform impregnation on the entirety of the Material (I), the pressure for the impregnation is a reduced pressure of 50 mmHg or less, preferably 10 mmHg or less, particularly preferably 1 mmHg or less.

Although differing depending upon the pore diameter of the Material (I), the viscosity of the molten thermosetting resin (II) and some others, the time required for the impregnation is generally 10 minutes to 4 hours.

In the second aspect of the present invention, the Material (I) is impregnated with the thermosetting resin (II) substantially in the same manner as above but without wrapping it with the cloth (IV), and the impregnated Material (I) is taken out of the impregnation container. Then, the resin (II) adhering onto surfaces of the impregnated Material (I) is substantially removed before the resin (II) gels, and cured under heat to obtain a composite material (III).

The above impregnation may be carried out by any one of a simultaneous impregnation method in which the Material (I) is placed in a container, a mold, etc., where the pressure reduction, heating, etc., can be carried out together with the resin (II) which has been weighed in advance, the pressure in the system is generally reduced, and the resin (II) is melted to impregnated the Material (I) with the resin (II); and a method in which the Material (I) is placed in the above container or mold, the system is generally reduced, the Material (I) is dehydrated and dried to remove substances adsorbed on the Material (I) such as water in air, and then the thermosetting resin (II) melted and degassed under reduced pressure is fed to impregnate the Material (I) with the resin (II). The pressure in the impregnation system is 50 mmHg or less, preferably 10 mmHg or less, particularly preferably 1 mmHg or less The resin (II) adhering to surfaces of the Material (I) is removed for preventing the composite material (III) from undergoing cracking when the composite material (III) is formed. The required degree of the removal of the above resin (II) differs depending upon the strength of the Material (I), which the above degree is that almost no resin remains when visually observed. When the removal is insufficient, cracking starts from a resin-adhering portion at a temperature between 150° C. and 30° C., and in some cases, the cracking reaches the interior of the Material (I).

Specifically, the resin (II) adhering to the Material (I) surface is removed as follows. The impregnated Material (I) is taken out of the impregnation container, the resin (II) adhering to the Material (II) surface is lightly cleaned with a spatula, and then the impregnated Material (I) is placed on a bed, etc., where the resin can drop off, whereby the above resin (II) can be removed by dropping and gasification on the surface before the resin (II) gels. Further, the Material (I) surface can be cleaned with a cloth, etc., before the resin (II) gels. Moreover, there may be employed a mechanical means such as centrifugal separation.

Curing

The composite material (III) is obtained by curing the above Material (I). The curing conditions are properly determined depending upon the kind of the thermosetting resin (II), and the like. The curing is preferably carried out so that the impregnated Material (I) is completely cured by preliminarily curing the impregnated Material (I) by heating it in the container or mold, or in the container specialized for the impregnation, further curing it, taking it out of the container, etc., curing it, and then further carrying out post-curing.

Slicing of the Cured Composite Material (III)

The above composite material (III) is sliced to obtain the base board having a thickness of 0.2 to 2 mm and a thickness allowance (common difference) of ±5 μm for printed wiring, provided by the present invention.

The composite material (III) can be sliced by a method using a slicing apparatus such as an outer diameter slicing diamond saw, an inner diameter slicing diamond saw, a multiwire saw, multiwire saw with diamond on wire, a multiblade saw or a multiblade saw with diamond on blade. According to the present invention, there can be obtained base boards having a thickness of 0.2 mm to 2 mm, typically 0.4 to 1.6 mm, and having high thickness accuracy. Further, a thin base board having a thickness of about 0.1 mm can be produced by carrying out a polishing process, etc. When a multiwire saw or a multiblade saw is used for multi-slicing, it is generally preferred to slice a combination of the composite material into a combination of base boards having a small thickness and base boards having a large thickness at the same time rather than slicing many composite materials having small thicknesses at the same time, although the degree of multi-slicing depends on a slicing apparatus. For slicing the material formed of aluminum nitride, no slicing method has been possible but a dry method in view of safety. However, the present invention permits a wet slicing method, particularly a slicing method using a coolant or an aqueous solution containing an abrasive material.

For slicing, the resin portion integrated with the cloth (IV) wrapping the sides of the Material (I) in the stacking direction is cut off, and the composite material (III) is set in a slicing machine so that the cured resin is not in contact with the saw.

Substrate Formed of Composite Material (III) for Printed Wiring

The base board obtained according to the process of the present invention has very high thickness accuracy, and this base board can be obtained as one having a very small thickness. Therefore, a base board which has a high dielectric constant but has a low dielectric loss tangent can be suitably used as a base board having higher performance for the use with high frequency.

The thermal expansion coefficient of the base board is greater than that of the Material (I). However, there can be easily obtained a base board having a thermal expansion coefficient of $10 \times 10^{-6} K^{-1}$ or less by selecting an apparent porosity.

The thermal conductivity of the base board is equivalent to, or higher than, that of the Material (I).

The composite material (III) formed in the present invention is a novel composite material in which the cured resin having a three-dimensional network structure is integrated with the Material (I) having a three-dimensional network structure. Therefore, the composite material (III) has about the same hardness as that of the Material (I) and greatly improved flexibility (impact strength). Therefore, the base board of the present invention has drilling processability equivalent to, or higher than, that of a general glass epoxy laminate. Further, when the base board is obtained from the inorganic continuous porous material (I) whose porosity is as large as about 30%, the base board easily permits the punching process.

The cured thermosetting resin is integrated with the Material. As a result, the base board is greatly improved in chemical properties. For example, when the Material (I) having poor water resistance or poor acid resistance such as β-wollastonite is used for producing the base board of the present invention, the base board is greatly improved in water resistance or acid resistance due to the thermosetting resin (II) used for the impregnation and cured. When the base board for printed wiring is produced from the Material (I) of AlN-h-BN, etc., the base board is structured so that AlN-h-BN having inferior water resistance is surrounded by the three-dimensional network of the resin used for the impregnation. Therefore, the base board is greatly improved in water resistance and chemical resistance, and it can be sliced by using water as a medium and permits wet electroless plating. When the base board for printed wiring is produced from the Material (I) of $Al_2O_3$-h-BN or $ZrO_2$-h-BN, generally, $Al_2O_3$ and $ZrO_2$ as a main component are too stable to carry out etching. In the present invention, however, the base board permits etching due to the presence of a portion impregnated with the thermosetting resin (II).

Therefore, either the resin side or the inorganic material side, or both are etched with an acidic, alkaline or oxidizing etching solution having room temperature or an elevated temperature as required, and the base board is surface-treated with a coupling agent, etc., whereby a strongly adhering metal film can be easily formed on the surface or through holes of the base board by a conventional electroless plating method.

Production of Printed Wiring Board

Printed wiring can be generally produced on the above base board for printed wiring by a method in which through holes are made in the base board as required, then the base board is plated with a metal and the intended printed wiring network is farmed, or by a method in which the base board is plated with a metal, through holes are made in the base board as required, the through holes are plated and the intended printed wiring network is formed. In particular, the former method works the physical properties of the base board for printed wiring, provided by the present invention, and permits the formation of a very fine printed wiring network since the through holes and the base board surface can be plated with copper in the same copper plating thickness and processed for forming the printed wiring.

When the above metal plating is carried out, the base board is surface-treated, and then plated by a known wet electroless plating method, a sputtering method, other dry method, or copper plating method using copper formate. This surface treatment is carried out by a washing method for cleaning, a method of treatment with a silane coupling agent, particularly an aminosilane coupling agent, a method of etching part of the inorganic material with an acid aqueous solution of phosphoric acid, sulfuric acid or chromic acid, a method of further treating the so-treated base board with a coupling agent, a method of etching part of the resin with an alkaline aqueous solution of sodium hydroxide or other or a method of treating the so-treated base board with a coupling agent.

EXAMPLES

The present invention will be explained further in detail hereinafter by reference to Examples.

Example 1

A thermosetting resin composition (to be referred to as "resin II-1" hereinafter) was prepared from 87% by weight of a cyanate ester-maleimide resin (BT-2100, supplied by Mitsubishi Gas Chemical Co., Inc. , 2,2-bis(4-cyanotophenyl)propane/bis(4-maleimidophenyl)methane=9/1), 10% by weight of a bisphenol A type epoxy resin ("Epikote" 152, supplied by Yuka-Shell Epoxy K.K., epoxy equivalent 172–179) and 3% by weight of γ-glycidoxypropyltrimethoxysilane by mixing these components.

A block of β-wollastonite ("MACHINAX" supplied by INAX Corp., bulk density 2.1, apparent porosity 21%, average pore radius 3.4 μm) having a size of 15.4 cm×15.4 cm×4 cm was wrapped with two layers of glass cloth, and the glass cloth was fixed with a copper wire. The wrapped block was placed in a container, and the pressure in the container was reduced to 5 mmHg. Then, the temperature in the container was increased to 110° C., and this temperature was maintained for 1 hour to dry the block under vacuum.

While the above vacuum degree was maintained, the above-prepared resin II-1 was melted at 110° C. and injected into the container, and the β-wollastonite was allowed to stand in the container for 1 hour to impregnate it with the resin.

Then, the above resin was cured at 150° C. for 1 hour and at 180° C. for 2 hours, and further post-cured at 200° C. for 3 hours to give a composite material.

The above composite material was sliced with a diamond saw (diamond tool #200, supplied by Nippon Diamond Corp.) to obtain base boards having a size of 15 cm×15 cm×0.4 mm and base boards having a size of 15 cm×15 cm×1.6 mm.

Further, a base board having a thickness of 0.2 mm was taken from the above composite material, and polished to give an excellent base board having a thickness of 0.1 mm.

The base boards having a thickness of 1.6 mm were measured for physical properties. Table 1 shows the results.

Example 2

Example 1 was repeated except that the β-wollastonite was replaced with β-wollastonite having a bulk density of 1.9, a porosity of 35% and an average pore radius of 1.8 μm.

The base boards having a thickness of 1.6 mm were measured for physical properties. Table 1 shows the results.

Referential Examples 1 and 2

The same porous materials as those used in Examples 1 and 2 were measured for physical properties. Table 1 shows the results.

Example 3

Five blocks of β-wollastonite ("MACHINAX" supplied by INAX Corp., bulk density 2.1, apparent porosity 21%, average pore radius 3.4 μm) having a size of 15.4 cm×15.4 cm×4 cm were stacked one on another through two layers of glass cloth. The resultant pile was wrapped with two layers of the same glass cloth, and the glass cloth was fixed with a copper wire. The wrapped pile was placed in a container with the stacked surfaces being perpendicular, and the pressure in the container was reduced to 5 mmHg. Then, the temperature in the container was increased to 110° C., and this temperature was maintained for 1 hour to dry the pile under vacuum.

While the above vacuum degree was maintained, the resin II-1 was melted at 110° C. and gradually injected into the container from under the container, and the pile of the β-wollastonite was allowed to stand in the container for 1 hour to impregnate it with the resin.

Then, the above resin was cured at 150° C. for 1 hour and at 180° C. for 2 hours, and further post-cured at 200° C. for 3 hours to give a composite material.

The above composite material was sliced with a multi-blade saw (blade thickness 0.25 mm, length 500 mm, using a #600 SiC abrasive spindle oil solution) so that base boards having a size of 15 cm×15 cm×0.635 mm and base boards having a size of 15 cm×1.5 cm×1.6 mm were obtained in an equal number.

The base boards having a thickness of 1.6 mm were measured for physical properties. Table 1 shows the results.

TABLE 1

|  | Unit | REx. 1 | Ex. 1 | REx. 2 | Ex. 2 |
| --- | --- | --- | --- | --- | --- |
| Bulk density*1 | g/cm$^3$ | 2.1 | 2.51 | 1.9 | 2.32 |
| Water absorption*2 | % | porous*8 | 0.2 | porous*8 | 0.2 |
| Flexural strength | MPa | 75 | 140 | 58 | 110 |
| Dielectric constant*3 |  | 4.8 | 4.0 | 5.8 | 5.4 |
| Dielectric loss tangent*4 |  | 0.011 | 0.006 | 0.007 | 0.0038 |
| Coefficient of thermal expansion*5 | $10^{-6}K^{-1}$ | 7.0 | 8.0 | 7.0 | 10.0 |
| Thermal conductivity*6 | W (mK)$^{-1}$ | 1.6 | 3.1 | 1.2 | 1.9 |
| Chemical Resistance*7 |  |  |  |  |  |
| 10% HCl |  | 38 | 1.1 | col-lapsed*8 | 0.8 |
| 10% NaOH |  | 0.3 | +0.5 | 0.4 | +1.1 |

Notes: REx. = Referential Example, Ex. = Example
*1: JIS-C-2141, unit g/cm$^3$
*2: JIS-R-1601, unit %
*3, *4: JIS-C-2141, measured at 1 MHz
*5: Measurement range, room temperature → 300° C. unit × $10^{-6}K^{-1}$
*6: Measured by a laser flash method, unit W (mK)$^{-1}$
*7: Sample 50 mm × 50 mm × 1.6 mm immersed at 23° C., 24 hours, and measured elution amount, unit mg/cm$^2$. "30" shows an increase.
*8: "porous" and "collapsed" mean "unmeasurable".

Example 4

A thermosetting resin composition (to be referred to as "resin II-2" hereinafter) was prepared from 95% by weight of a cyanate ester-maleimide resin (BT-2100, supplied by Mitsubishi Gas Chemical Co., Inc., 2,2-bis(4-cyanotophenyl)propane/bis(4-maleimidophenyl)methane=9/1) and 5% by weight of a bisphenol A type epoxy resin ("Epikote" 152, supplied by Yuka-Shell Epoxy K.K., epoxy equivalent 172–179) by mixing these components.

Then, the procedures of Example I were repeated except that the resin II-1 was replaced with the resin II-2 and that the β-wollastonite was replaced with AlN-h-BN having a size of 6×6×2.5 cm and having an h-BN content of 12.5%, a bulk density of 2.45, a porosity of 20.6% and an average radius of 0.66 μm. The above aluminum nitride-hexagonal boron nitride had been preliminarily dried at 70° C. for 72 hours.

Substrates having a thickness of 1.6 mm were measured for physical properties. Table 2 shows the results. Specifically, the base boards were measured for dielectric constants and dielectric loss tangents when they were in a dry state, after they were allowed to stand at a relative humidity of 55% for 24 hours and after they were immersed in water for 48 hours. Further, the base boards which had been allowed to stand at a relative humidity of 55% for 24 hours were examined for temperature dependency of their dielectric constants and dielectric loss tangents by measuring them at temperatures shown in Table 2. The base boards were also examined for temperature dependence of their thermal conductivity by measuring them at temperatures shown in Table 2.

Referential Example 3

The same aluminum nitride-hexagonal boron nitride composite material was also measured for physical properties. Table 2 shows the results.

Table 2 clearly shows that the base board for printed wiring, provided by the present invention, is greatly improved in strength and permits the immersion in water and the measurement of chemical resistance. Further, the decrease in the physical property values of the base board of the present invention after the immersion in water and the test on chemical resistance is very small. Moreover, it can be understood that the base board of the present invention shows thermal conductivity and a coefficient of thermal expansion which are in no way inferior to the properties of the aluminum nitride-hexagonal boron nitride.

|  | Unit | REx. 3 | Ex. 4 |
| --- | --- | --- | --- |
| Bulk density*1 | g/cm$^3$ | 2.45 | 2.73 |
| Water absorption*2 | % | porous*8 | 0.1 |
| Flexural strength | MPa | 110 | 170 |
| Dielectric constant*3 |  |  |  |
| In a dry state |  | 6.8 | 6.3 |
| After 24 hours at 55% RH |  | — | 6.45 |
| 50° C. |  | — | 6.55 |
| 100° C. |  | — | 6.57 |
| 150° C. |  | — | 6.58 |
| 200° C. |  | — | 6.61 |
| After immersion for 46 hours |  | porous | 6.5 |
| Dielectric loss tangent *4 |  |  |  |
| In a dry state |  | 0.0015 | 0.0020 |
| After 24 hours at 55% RH |  | — | 0.0025 |
| 50° C. |  | — | 0.0024 |
| 100° C. |  | — | 0.0021 |
| 150° C. |  | — | 0.0022 |
| 200° C. |  | — | 0.0020 |
| After immersion for 48 hours |  | porous | 0.0071 |
| Coefficient of thermal expansion*5 | $10^{-6}K^{-1}$ | 4.9 | 5.1 |
| Thermal conductivity*6 | W (mK)$^{-1}$ |  |  |
| 20° C. |  | 70 | 71 |
| 105° C. |  | 66 | 67 |
| 190° C. |  | 60 | 60 |
| 295° C. |  | 52 | 52 |
| Chemical resistance*7 |  |  |  |
| 10% HCl | mg/cm$^2$ | — | +0.3 (0.15) |
| 10% NaOH | mg/cm$^2$ | — | +0.5 (0.25) |

Notes: REx. = Referential Example, Ex. = Example
*1: JIS-C-2141, unit g/cm$^3$

-continued

|  | Unit | REx. 3 | Ex. 4 |
|---|---|---|---|

*2: JIS-R-1601, unit %
*3, *4: JIS-C-2141, measured at 1 MHz
*5: Measurement range, room temperature → 300° C. unit × $10^{-6}K^{-1}$
*6: Measured by a laser flash method, unit W $(mK)^{-1}$
*7: Sample 50 mm × 50 mm × 1.6 mm immersed at 23° C., 24 hours, and measured elution amount, unit mg/cm². "30" shows an increase.
*8: "porous" and "collapsed" mean "unmeasurable".
*9: Not measured.

Examples 5–7

Example 4 was repeated except that the AlN-h-BN was replaced with AlN-h-BN having h-BN content of 12.5%, a bulk density of 2.46, a porosity of 21.4% and an average pore radius of 1.1 μm (Example 5), AlN-h-BN having h-BN content of 15%, a bulk density of 2.35, a porosity of 25.4 % and an average pore radius of 0.78 μm (Example 6), and AlN-h-BN having h-BN content of 20%, a bulk density of 2.05, a porosity of 32.3 % and an average pore radius of 1.2 μm (Example 7).

The base boards having a thickness of 1.6 mm were measured for thermal conductivity to show 66 W(mK)$^{-1}$ in Example 5, 59 W(mK)$^{-1}$ in Example 6 and 29 W(mK)$^{-1}$ in Example 7. In the base board having a thickness of 0.635, obtained in Example 7, through-holes could be easily made by punching.

Example 8

Four pieces of Al-h-BN having h-BN content of 12.5 %, a bulk density of 2.46, a porosity of 21.4 % and an average pore radius of 1.1 μm were stacked one on another through two layers of a glass cloth, and the resultant pile was wrapped with the same glass cloth as above. The cloth was fixed with a copper wire. The pile was dried at 70° C. for 72 hours. Then, the pile was treated in the same manner as in Example 4 to give a composite material.

The above composite material sliced with a multiblade saw (blade thickness 0.25 mm, length 500 mm, using a #600 SiC; abrasive spindle oil solution) so that base boards having a size of 15 cm×15 cm×0.635 mm and base boards having a size of 15 cm×15 cm×1.6 mm were obtained in an equal number.

The base boards having a thickness of 1.6 mm were measured for physical properties to show the same results as those obtained in Example 4.

Example 9

Many through holes having a diameter of 0.4 mm were drilled in predetermined positions on the base board having a thickness of 0.635 mm, obtained in Example 3. The base board was immersed in an aqueous solution containing 5% of a phosphoric acid for 2 minutes to carry out the etching treatment of the base board, and washed with water. Then, the base board was immersed in an aqueous solution containing 1% of N-(β-(aminoethyl)-γ-aminopropyltrimethoxysilane for 3 minutes, and then dried at 110° C. for 5 minutes. The base board was plated with copper by electroless plating and further by electrolytic plating to form a copper film having a thickness of 15 μm. The resultant copper-clad base board was measured for a copper foil peel strength, and the surfaces (degree of unevenness) of walls of the sectioned through holes were observed. Table 3 shows the results.

Example 10

Example 9 was repeated except that the base board was replaced with the base board having a thickness of 0.635 mm obtained in Example 8 and that the etching treatment was omitted. Table 3 shows the results.

TABLE 3

|  | Unit | Example 9 | Example 10 |
|---|---|---|---|
| Inorganic porous material |  | β-wollastonite | AlN-h-BN |
| Copper foil peel strength | kg/cm | 1.5 | 1.6 |
| Degree of unevenness of hole wall (maximum) | (μm) | 0.4 | 0.3 |

Example 11

Grooves having a depth of about 0.5 mm were formed on both surfaces of each of five blocks of the same β-wollastonite porous material as that used in Example 1, at intervals of 10 mm.

The above five blocks were placed in an aluminum container having, as partition, copper wires having a diameter of 1 mm, and the aluminum container with the five blocks therein was placed in a dryer and dried at 150° C. for 4 hours.

The dried five blocks were then placed in a vacuum impregnator, and the pressure in the vacuum impregnator was reduced to 5 mmHg. Then, the temperature inside the vacuum impregnator was increased to 10° C., the five blocks were maintained at this temperature for 1 hour to carry out the drying treatment under vacuum.

The same resin as the resin II-1 prepared in Example 1 was fed to a container in the vacuum impregnator, degassed by melting it at 110° C. and gradually poured into the aluminum container to carry out the impregnation of the five blocks for 1 hour.

The aluminum container was taken out, the resin on the surfaces of each block was lightly cleaned off with a spatula and then each block was placed on two rods having a triangular cross section. The five blocks were placed in dryers, and cured at 150° C. for 1 hour, at 180° C. for 30 minutes, at 185° C. for 15 minutes, at 200° C. for 1 hour or at 230° C. for 3 hours to give composite materials. While one block was dried at 180° C., the resin on the block surfaces was wiped off with a piece of cloth.

No cracking was found on the surfaces of each block, and the surfaces of each of the composite materials were excellent.

The above-obtained composite materials were temporarily attached with an adhesive, set on the same multiblade saw as that used in Example 1 and cut to boards having a size of 15 cm×15 cm×0.635 mm and boards having a size of 15 cm×15 cm×1.6 mm. The number of the boards having a thickness of 0.635 mm was the same as the number of boards having a thickness of 1.6 mm.

Example 12

A thermosetting resin composition (to be referred to as "resin II-3" hereinafter) was prepared from 98% by weight of a cyanate-maleimide resin [trade name: 13T-2100, 2,2-bis(4-cyanatophenyl)propane/bis(4 -maleimidephenyl)methane=9/1 (weight ratio)] and 2% by weight of a bisphenol A type epoxy resin (trade name: Epikote 152, epoxy equivalent 172–179, supplied by Yuka-Shell Epoxy K.K.).

Then, Example 11 was repeated except that the resin II-1 was replaced with the above resin II-3, that blocks of β-wollastonite were replaced with four blocks of the same aluminum nitride-boron nitride composite material (h-BN content 12.5%, bulk density 2.45, apparent porosity 20.6%, average pore diameter 0.66 μm) as that used in Example 4 anti that the above blocks were preliminarily dried at 70° C. for 72 hours. As a result, impregnated composite materials free of cracking were obtained.

The above-obtained composite materials were temporarily attached with an adhesive, set on the same multiblade saw as that used in Example 1 and cut to boards having a size of 15 cm×15 cm×0.635 mm and boards having a size of 1.5 cm×15 cm×1.6 mm. The number of the boards having a thickness of 0.635 mm was the same as the number of boards having a thickness of 1.6 mm.

Further, part of the above boards and the above composite materials were evaluated for impact resistance in the following method.

A sample board having a size of 2.5 cm×8.0 cm and a predetermined thickness was placed on two supports which were 35 mm distant from each other, and an iron ball having a weight of 55 g was dropped on the center of the board to determine a smallest height at which the board underwent cracking, breaking and fracture.

The above method is specified in JIS as a test method for paper phenol resin laminates used for mounting parts thereon.

The value required of a 1.6 mm thick paper phenol laminate in the above method is at least 14 cm, and those in practical use show the following values.

For hot punch processing: 18–30 cm
For cold punch processing: 35–50 cm
Table 4 shows the results.

TABLE 4

| | Inorganic porous material | | Impregnated or not impregnated | Flexural strength MPa | Impact strength against a dropped weight (cm) | |
| --- | --- | --- | --- | --- | --- | --- |
| | kind | porosity | | | 1.6 mm | 5 mm |
| REx. 1 | B* | 21% | No | 75 | —* | 25 |
| Ex. 1 | B* | 21% | Yes | 140 | 22 | 40 |
| REx. 2 | B* | 36% | No | 58 | —* | 25 |
| Ex. 2 | B* | 36% | Yes | 110 | 24 | 45 |
| REx. 3 | AlN-h-BN | 20% | No | 110 | 12 | — |
| Ex. 4 | AlN-h-BN | 20% | Yes | 170 | 34 | — |

Notes) REx. = Referential Example, Ex. = Example
B* = β-wollastonite
—* = It was difficult to prepare 1.6 mm thick test pieces which were good for testing. The test pieces obtained showed a value of 5–7 cm.

As explained above, the base board for printed wiring, obtained according the process of the present invention, has remarkably high thickness accuracy since it is produced by cutting the composite material, and further it can be also produced as one having a thickness of 2 mm. Further, the base board of the present invention has a low coefficient of thermal expansion and high heat dissipation properties and has higher heat resistance than a cured product of the resin used for the impregnation. The base board of the present invention is therefore a novel base board which retains excellent properties of ceramics and is imparted with the processability of plastics. The base board of the present invention is useful as a base board for an antenna for high frequency, a part module for high frequency and others and as a base board for directly mounting semiconductor chips.

What is claimed is:

1. A process for the production of a base board for printed wiring, which comprises the steps of wrapping a block of continuous porous ceramic material with a cloth, impregnating the wrapped block continuous porous ceramic material with a thermosetting resin under reduced pressure, curing the thermosetting resin to form a composite material, and slicing the composite material into base boards having a thickness of 0.2 to 2 mm and a thickness allowance of ±5 μm or less.

2. A process according to claim 1, wherein the block continuous porous ceramic material has a porosity of 12 to 36% and an average pore diameter of 0.5 to 6 μm.

3. A process according to claim 1, wherein the block continuous porous ceramic material is formed of a material selected from the group consisting of aluminum nitride-hexagonal boron nitride and β-wollastonite.

4. A process according to claim 1, wherein the cloth is a glass woven fabric.

5. A process according to claim 1, wherein the block continuous porous ceramic material is preliminarily heat-treated at 70° to 250° C. under reduced pressure at 30 mmHg for 0.5 to 72 hours.

6. A process according to claim 1, wherein the composite material is sliced with a saw selected from the group consisting of a multiwire saw, a multiblade saw, and an inner diameter slicing diamond saw.

7. A process for the production of a base board for printed wiring, which comprises the steps of impregnating a block of continuous porous ceramic material with a thermosetting resin in an impregnation vessel under reduced pressure, taking the block continuous porous ceramic material impregnated from the impregnation vessel, substantially removing the thermosetting resin adhering to surfaces of the block continuous porous ceramic material before the thermosetting resin forms a gel, curing the remaining thermosetting resin under heat to form a composite material, and slicing the composite material into base boards having a thickness of 0.2 to 2 mm and a thickness allowance of not greater than ±5 μm.

8. A process according to claim 7, wherein the block inorganic continuous porous ceramic material has a porosity of 12 to 36% and an average pore diameter of 0.5 to 6 μm.

9. A process according to claim 7, wherein the block continuous porous ceramic material is formed of a material selected from the group consisting of aluminum nitride-hexagonal boron nitride and β-wollastonite.

10. A process according to claim 7, wherein the block inorganic continuous porous material is preliminarily heat-treated at 70° to 250° C. under reduced pressure at 30 mmHg for 0.5 to 72 hours.

11. A process according to claim 7, wherein the composite material is sliced with a saw selected from the group consisting of a multiwire saw, a multiblade saw, and an inner diameter slicing diamond saw.

* * * * *

UNITED STATES PATENT AND TRADEMARK OFFICE
CERTIFICATE OF CORRECTION

PATENT NO.  : 5,531,945
DATED       : July 2, 1996
INVENTOR(S) : KAZUYUKI OHYA and NORIO SAYAMA It is certified that error appears in the above-indentified patent and that said Letters Patent is hereby corrected as shown below:

Column 16, line 64 (claim 8, line 2), delete the word "inorganic".

Column 17, line 4 (claim 10, line 2), delete the word "inorganic" and insert the word "ceramic" after the word "porous".

Signed and Sealed this

Fifteenth Day of April, 1997

Attest:

BRUCE LEHMAN

*Attesting Officer*  *Commissioner of Patents and Trademarks*